US008503212B2

(12) United States Patent
Jung et al.

(10) Patent No.: US 8,503,212 B2
(45) Date of Patent: Aug. 6, 2013

(54) SEMICONDUCTOR MEMORY APPARATUS WITH POWER-MESHED STRUCTURE

(75) Inventors: Boo Ho Jung, Ichon-shi (KR); Jun Ho Lee, Ichon-shi (KR); Hyun Seok Kim, Ichon-shi (KR); Sun Ki Cho, Ichon-shi (KR); Yang Hee Kim, Ichon-shi (KR); Young Won Kim, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 236 days.

(21) Appl. No.: 12/843,647

(22) Filed: Jul. 26, 2010

(65) Prior Publication Data

US 2011/0235385 A1    Sep. 29, 2011

(30) Foreign Application Priority Data

Mar. 29, 2010  (KR) .................. 10-2010-0027820

(51) Int. Cl.
*G11C 5/06* (2006.01)
*H01L 23/52* (2006.01)

(52) U.S. Cl.
USPC .......... 365/63; 365/51; 365/226; 365/230.03; 257/503; 257/776

(58) Field of Classification Search
USPC ............... 365/51, 226, 230.03; 257/503, 776
See application file for complete search history.

(56) References Cited

U.S. PATENT DOCUMENTS

| 5,325,336 | A | * | 6/1994 | Tomishima et al. | .......... 365/207 |
| 5,867,440 | A | * | 2/1999 | Hidaka | .......... 365/226 |
| 6,150,689 | A | * | 11/2000 | Narui et al. | .......... 257/306 |
| 6,337,593 | B1 | * | 1/2002 | Mizuno et al. | .......... 327/534 |
| 6,480,989 | B2 | | 11/2002 | Chan et al. | |
| 6,501,672 | B1 | * | 12/2002 | Sekiguchi et al. | .......... 365/72 |
| 6,785,157 | B2 | * | 8/2004 | Arimoto et al. | .......... 365/149 |
| 7,259,978 | B2 | * | 8/2007 | Park et al. | .......... 365/63 |
| 7,336,089 | B2 | | 2/2008 | Yang | |
| 7,808,804 | B2 | * | 10/2010 | Kwon | .......... 365/51 |
| 2006/0123376 | A1 | | 6/2006 | Vogel et al. | |
| 2006/0126416 | A1 | * | 6/2006 | Eun et al. | .......... 365/226 |

FOREIGN PATENT DOCUMENTS

KR        1020050012032 A        1/2005

* cited by examiner

*Primary Examiner* — Allison P Bernstein
(74) *Attorney, Agent, or Firm* — William Park & Associates Patent Ltd.

(57) ABSTRACT

A semiconductor memory apparatus includes a plurality of banks each having a plurality of cell mats; a plurality of power lines disposed over predetermined portions of each of the plurality of banks; a column control region disposed adjacent to at least one of sides of each bank which are perpendicular to an extending direction of the power lines; and a conductive plate disposed over the column control region and electrically connected to the plurality of power lines.

6 Claims, 5 Drawing Sheets

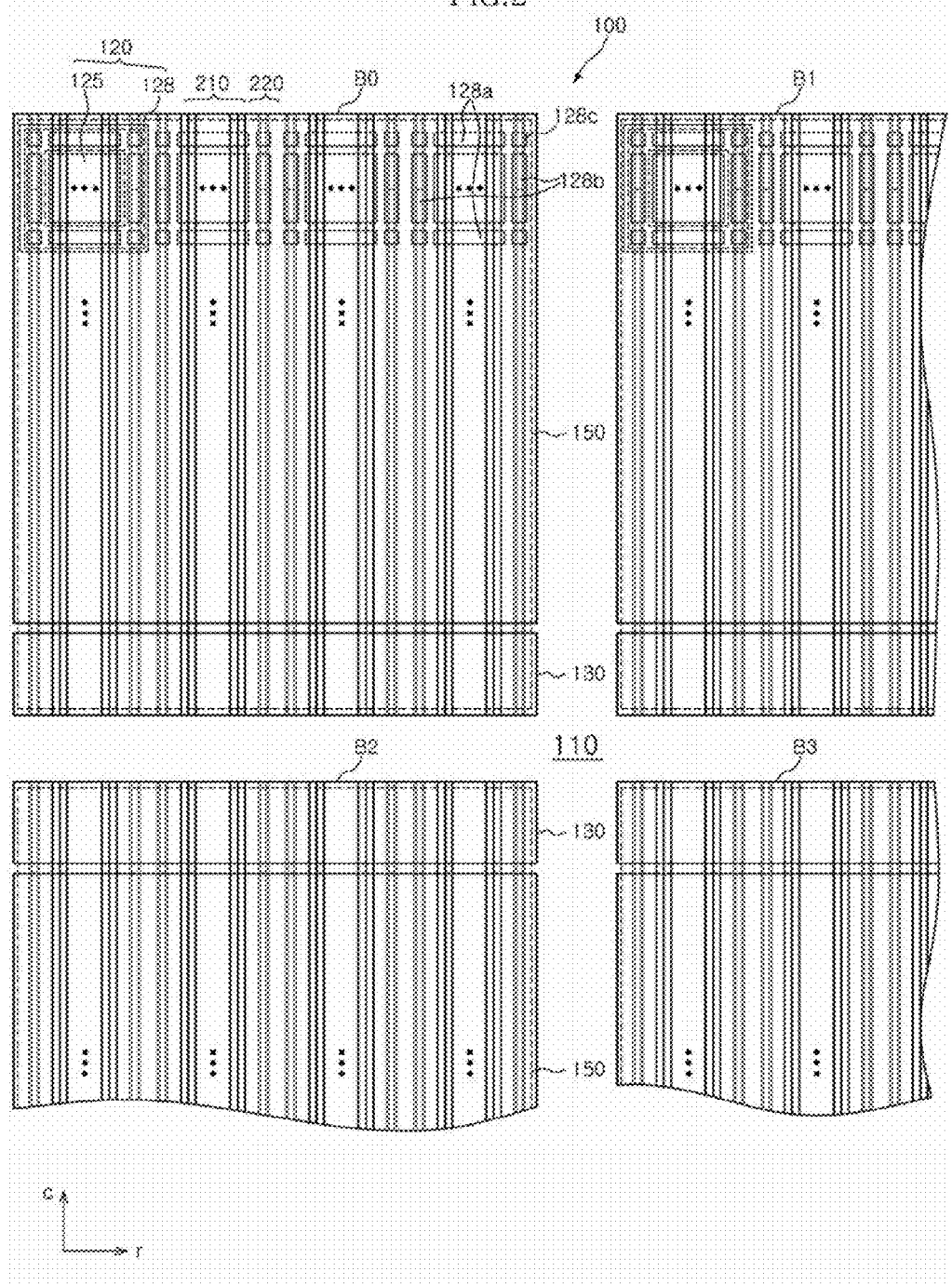

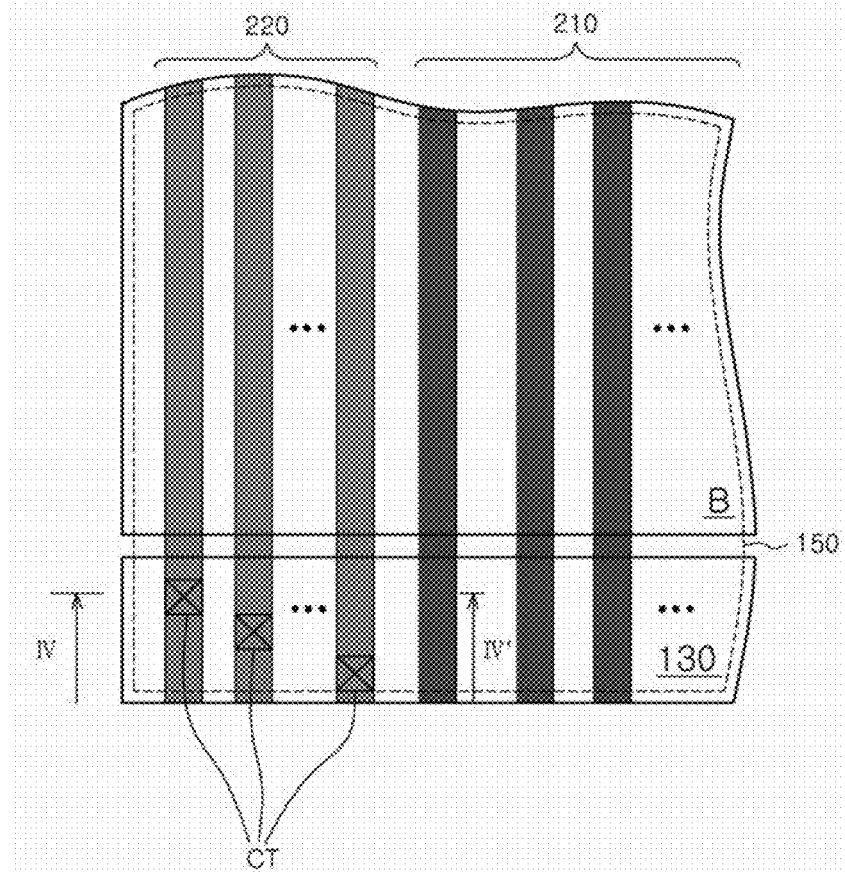
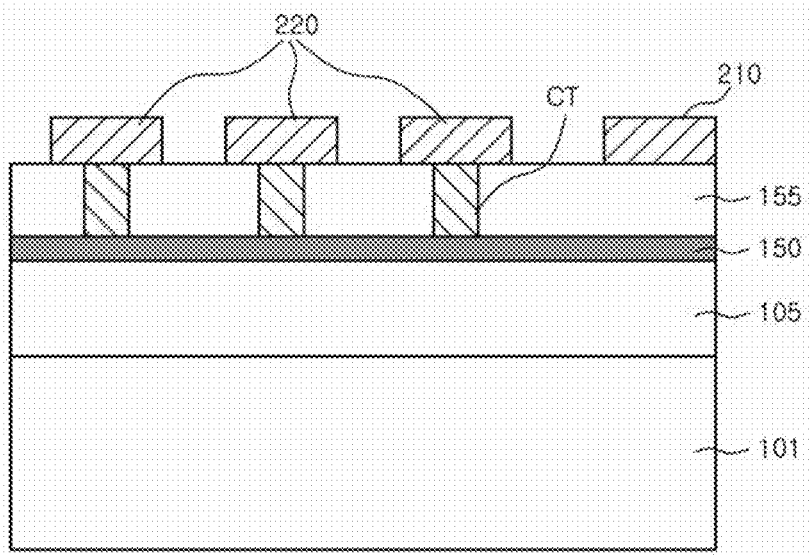

SEMICONDUCTOR MEMORY APPARATUS WITH POWER-MESHED STRUCTURE

CROSS-REFERENCES TO RELATED APPLICATION

The present application claims priority under 35 U.S.C. §119(a) to Korean Application No. 10-2010-0027820, filed on Mar. 29, 2010, in the Korean Intellectual Property Office, which is incorporated herein by reference in its entirety as if set forth in full.

BACKGROUND

1. Technical Field

The present invention relates to a semiconductor integrated circuit, and more particularly, to a semiconductor memory apparatus with a power-meshed structure.

2. Related Art

Accessing data in a semiconductor memory apparatus needs operating voltages such as an external power supply voltage, a ground voltage, an internal voltage, a reference voltage and a high voltage. The operating voltages are transferred to cell regions of the semiconductor memory apparatus through power lines.

FIG. 1 is a plan view illustrating a power line structure of a typical semiconductor memory apparatus. Referring to FIG. 1, in a semiconductor memory apparatus, as an integration density and a storage capacity increase geometrically, the number of signal lines S also increases. Because of this, the area the signal lines S are disposed occupies a majority part of a cell array region 10. Power lines P1 and P2 are disposed to extend horizontally and vertically in driving circuit regions 12, 15 and 18 which are defined on the peripheries of the cell array region 10. The power lines P1 and P2, which have the same levels, are connected to each other in a meshed structure through via contacts 20.

The power lines P1 and P2 are disposed in the relatively narrow driving circuit regions 12, 15 and 18. As the integration density of the semiconductor memory apparatus gradually increases, the number and the line width of the power lines P1 and P2 gradually decrease and it is difficult to secure the necessary resistance of the power lines P1 and P2.

If the resistance of the power lines P1 and P2 is not secured when a preset current to a certain current source is necessary, a power supply voltage (VDD) may fluctuate over time, which may result in malfunction of the semiconductor memory apparatus.

SUMMARY

In one exemplary embodiment of the present invention, a semiconductor memory apparatus includes: a memory bank having a plurality of cell mats; a plurality of power lines disposed in parallel over predetermined portions of the memory bank; a column control region disposed adjacent to a side of the memory bank, an edge line of the side of the memory bank is perpendicular to an extending direction of the plurality of power lines; and a conductive plate disposed over the column control region and electrically connected to the plurality of power lines.

In another exemplary embodiment of the present invention, a semiconductor memory apparatus includes: a plurality of banks delimited on a semiconductor substrate and each having a plurality of cell mats which are disposed in a matrix shape; a plurality of power lines disposed over predetermined portions of each of the plurality of banks; a column control region disposed adjacent to at least one of sides of each bank which are perpendicular to an extending direction of the power lines; a plate electrode disposed between the semiconductor substrate and the plurality of power lines in each bank and extending over the column control region; and contact parts disposed over the column control region and electrically connecting the power lines with the plate electrode.

In another exemplary embodiment of the present invention, a semiconductor memory apparatus includes: a plurality of banks delimited on a semiconductor substrate and each having a plurality of cell mats which are disposed in a matrix shape; a plurality of power lines disposed over predetermined portions of each of the plurality of banks; a column control region disposed adjacent to at least one of sides of each bank which are perpendicular to an extending direction of the power lines; a plate electrode disposed between the semiconductor substrate and the plurality of power lines in each bank and extending over the column control region; a conductive pattern disposed on the same plane as the plate electrode and electrically isolated from the plate electrode; and contact parts disposed over the column control region and electrically connecting the power lines with the conductive pattern.

BRIEF DESCRIPTION OF THE DRAWINGS

Features, aspects, and embodiments are described in conjunction with the attached drawings, in which:

FIG. 2 is a plan view illustrating a semiconductor memory apparatus in accordance with an embodiment of the present invention;

FIG. 3 is an enlarged plan view illustrating a column control block shown in FIG. 2;

FIG. 4 is a cross-sectional view taken along the line IV-IV' of FIG. 3;

DETAILED DESCRIPTION

Figure 1:
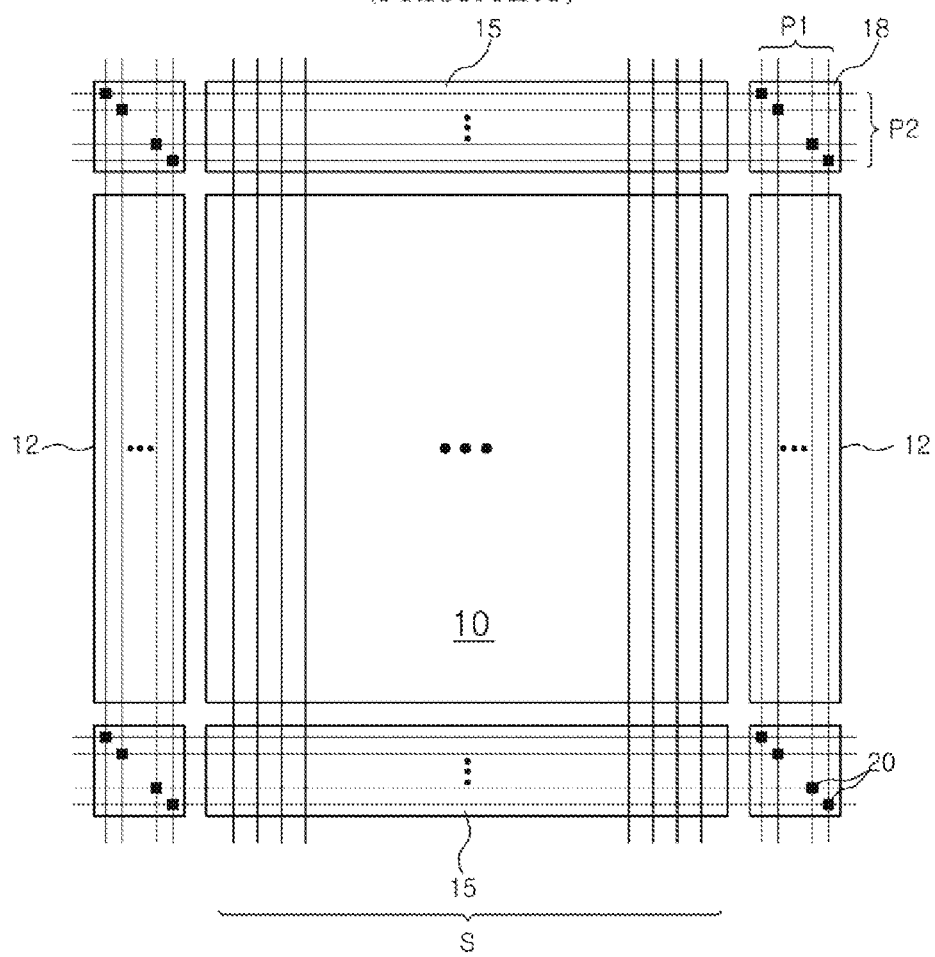
FIG. 1 is a plan view illustrating a power line structure of a typical semiconductor memory apparatus.

Reference will now be made in detail to the exemplary embodiments consistent with the present disclosure, examples of which are illustrated in the accompanying drawings. Whenever possible, same reference numerals will be used throughout the drawings to refer to the same or like parts.

FIG. 2 is a plan view illustrating a semiconductor memory apparatus 100 in accordance with an embodiment of the present invention. The semiconductor memory apparatus 100 shown in FIG. 2 may be divided into a plurality of banks B0 through B3. The plurality of banks B0 through B3 may be disposed in a matrix shape with a predetermined interval in a row direction r (for example, a word line direction) and a column direction c (for example, a bit line direction). The area between the banks B0 through B3 constitute a peripheral region 110 of the semiconductor memory apparatus 100.

Each of the banks B0 through B3 is composed of a plurality of cell mats 120 which are disposed in a matrix shape. Each cell mat 120 has a cell array region 125 along with a driving circuit region 128 which surrounds the cell array region 125.

A plurality of signal lines 210 and a plurality of power lines 220 may be disposed on each of the banks B0 through B3. To increase the efficiency of disposal and the stability of signal transfer, the plurality of signal lines 210 may be disposed on the cell array region 125, and the plurality of power lines 220 may be disposed on the driving circuit region 128.

The driving circuit region 128 includes sense amplifier blocks 128a disposed on a pair of opposing sides of the cell array region 125, sub word line driving blocks 128b disposed on the other pair of opposing sides of the cell array region 125, perpendicular to the pair of sides having the sense amplifier blocks 128a disposed thereon, and cross regions 128c which are disposed at crossing points of the sense amplifier blocks 128a and the sub word line driving blocks 128b.

The power lines 220 include power lines which extend in the row direction r. In other words, the power lines are disposed over the sense amplifier blocks 128a along the major axis direction of the sense amplifier blocks 128a. The power lines, which extend in the column direction c, are disposed over the sub word line driving blocks 128b along the major axis direction of the sub word line driving blocks 128b. These power lines are stacked with dielectric layers (not shown) interposed between them. The power lines, which receive voltages of the same level, are electrically connected to each other to form a power-meshed structure. For the sake of simplicity, only the power lines 220 which extend in the column direction c are illustrated in the exemplary embodiment shown in the drawing. The numbers of the signal lines 210 and the power lines 220 may vary depending upon the integration density and the operating speed of the semiconductor memory apparatus.

Column control blocks 130 are disposed on one side of each of the respective banks B0 through B3. Each of the column control blocks 130 is preferably disposed on one side of the respective banks B0 through B3, which are parallel to the row direction r, so as to control the power lines 220 which extend in the column direction c. The column control blocks 130 are blocks for controlling the signal transfer of column-related lines, that is, bit lines and data input lines, and may include main decoders (not shown) and pre-decoders (not shown). The signal lines 210 and the power lines 220 extend on the column control blocks 130, and may provide predetermined signals and power to corresponding parts of the column control blocks 130.

The semiconductor memory apparatus 100, in particular, a DRAM, includes capacitors as data storage media. The capacitors are formed in the respective memory cells that constitute the cell array region 125. Each capacitor is composed of a storage electrode, a dielectric and a plate electrode. The storage electrode is formed for each memory cell, whereas the plate electrode is formed commonly for a plurality of capacitors in each of the banks B0 through B3. Accordingly, plate electrodes are disposed on the respective banks B0 through B3.

However, in the embodiment of the present invention, the plate electrodes 150 extend over the column control blocks 130 and are electrically connected to the power lines 220 which are disposed over the column control blocks 130.

FIG. 3 is an enlarged plan view illustrating a part of an optional bank B and the column control block 130 shown in FIG. 2, and FIG. 4 is a cross-sectional view taken along the line IV-IV' of FIG. 3.

Referring to FIGS. 3 and 4, a device layer 105, which includes circuit devices (not shown), is formed on a semiconductor substrate 101. The uppermost part of the device layer 105 may include a capacitor dielectric layer which is not shown in a drawing. The plate electrode 150 is formed over the device layer 105. The plate electrode 150 may include a doped polysilicon layer or a metal layer, and is disposed to extend over not only the bank B but also the column control block 130.

An interlayer dielectric 155 is formed over the resultant semiconductor substrate 101 with the plate electrode 150 being formed therein, and via holes are defined to expose predetermined portions of the plate electrode 150 which is disposed over the column control block 130. The via holes may be defined in areas over which the power lines 220 are to be disposed. Contact plugs CT, that is, via contacts are formed in the interlayer dielectric 155 to fill the via holes. By depositing a metal layer over the interlayer dielectric 155 which is formed with the via contacts CT and patterning the metal layer, the signal lines 210 and the power lines 220 are formed. Since the power lines 220 contact the via contacts CT, the power lines 220 are electrically connected to the plate electrode 150.

Figure 5:
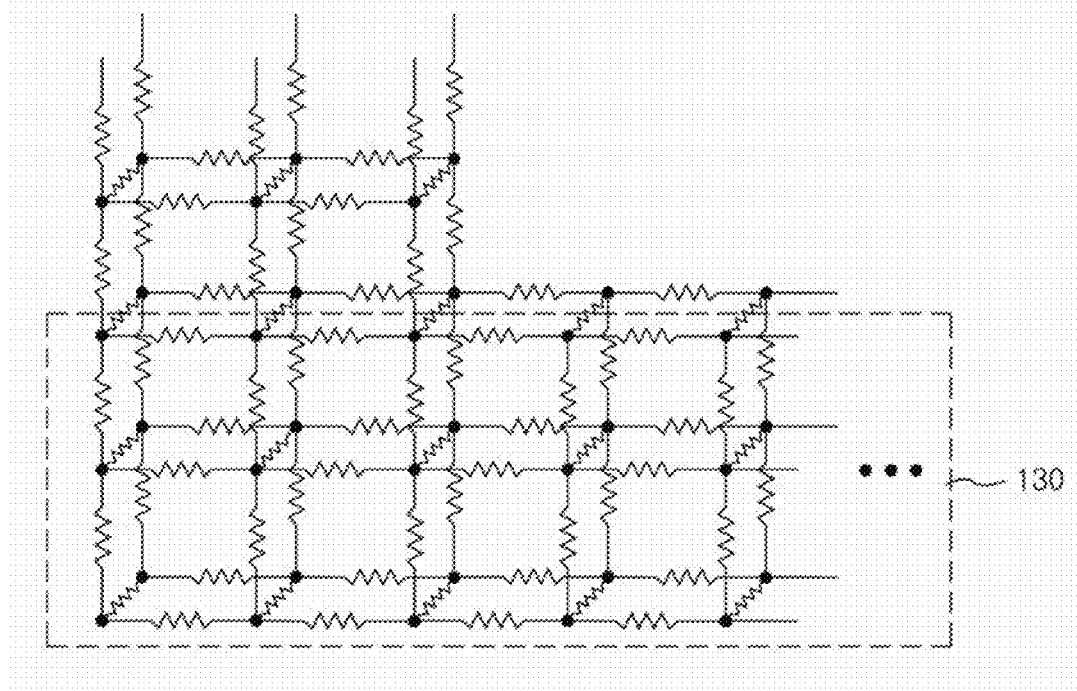
FIG. 5 is an equivalent circuit diagram of power lines in the semiconductor memory apparatus in accordance with the embodiment of the present invention.

FIG. 5 is an equivalent circuit diagram of power lines in the semiconductor memory apparatus in accordance with the embodiment of the present invention. Since the power lines 220 electrically contact the plate electrode 150 over the column control block 130, the effective resistances of the power lines 220 are connected effectively in parallel through multiple layers as shown in FIG. 5. Therefore, as the line width and the number of the power lines 220 are decreased, resistance may be stabilized and noise may be reduced.

Also, since the plate electrode 150 extends over the column control block 130 which is structurally less complicated than the bank B and the via contacts CT are formed over the column control block 130, the problems of misalignment and poor contacts which may result from increase in pattern density can be solved.

Figure 6:
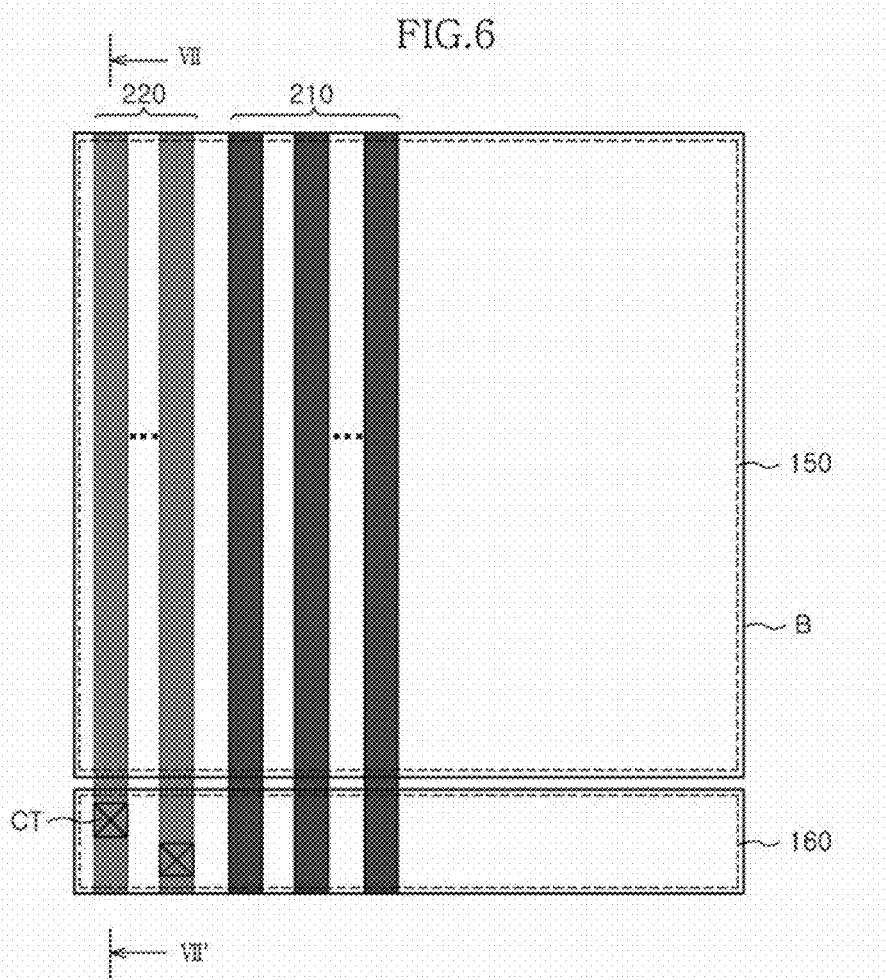
FIG. 6 is a plan view illustrating a semiconductor memory apparatus in accordance with another embodiment of the present invention.
Figure 7:
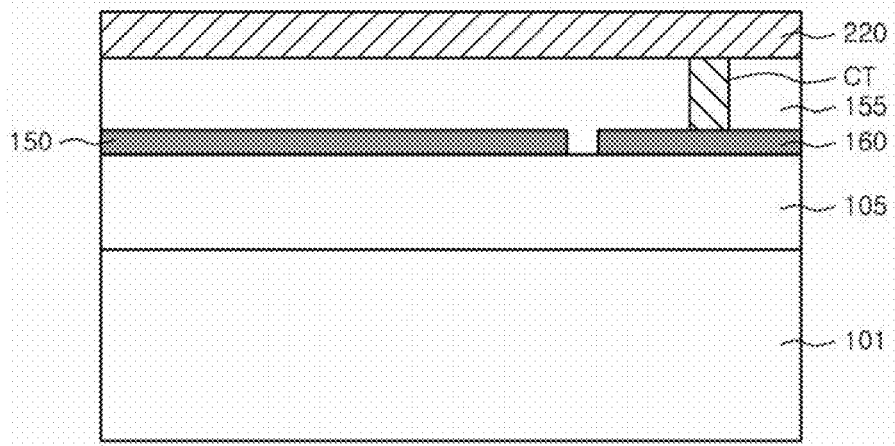
FIG. 7 is a cross-sectional view taken along the line VII-VII' of FIG. 6.

FIG. 6 is a plan view illustrating a semiconductor memory apparatus in accordance with another embodiment of the present invention, and FIG. 7 is a cross-sectional view taken along the line VII-VII' of FIG. 6. Referring to FIGS. 6 and 7, the plate electrode 150 can be disposed only over the bank B, and a stabilization pattern 160 can be additionally formed over the device layer 105 on the same plane as the plate electrode 150. The stabilization pattern 160 can be formed in a masking process for defining the plate electrode 150.

An interlayer dielectric 155 is formed over the plate electrode 150 and the stabilization pattern 160, and via contacts CT are formed in the interlayer dielectric 155 by a method generally known in the art in such a way as to contact the stabilization pattern 160. The signal lines 210 and the power lines 220 which contact the via contacts CT are formed over the interlayer dielectric 155.

As is apparent from the above description, in the embodiments of the present invention, a plate electrode or a stabilization pattern is disposed to extend over and/or be placed over a column control block, and is electrically connected to power lines which extend over the column control block.

Through this, the power lines can secure a sufficient resistance, and power supply capability can be improved and noise can be reduced.

Furthermore, since the power lines and the plate electrode or the stabilization pattern contact each other over the column control block in which circuit patterns are relatively sparsely disposed, an increased number of contacts can be formed, and noise can be further reduced and misalignment and the formation of poor contacts may be substantially prevented.

While certain embodiments have been described above, it will be understood to those skilled in the art that the embodiments described are by way of example only. Accordingly, the semiconductor memory apparatus with a power-meshed structure described herein should not be limited based on the described embodiments. Rather, the semiconductor memory apparatus with a power-meshed structure described herein should only be limited in light of the claims that follow when taken in conjunction with the above description and accompanying drawings.

What is claimed is:

1. A semiconductor memory apparatus comprising:
a memory bank having a plurality of cell mats which are disposed in a matrix shape;
a plurality of power lines disposed in parallel over predetermined portions of the memory bank comprising a plate electrode disposed between a surface on which the power lines are disposed and a surface of a semiconductor substrate;
a column control region disposed adjacent to a side of the memory bank, an edge line of the side of the memory bank is perpendicular to an extending direction of the plurality of power lines; and
a conductive plate disposed over the column control region and electrically connected to the plurality of power lines, wherein the conductive plate comprises a portion which extends from the plate electrode, and portions for electrically connecting the conductive plate and the power lines are disposed over the column control region.

2. The semiconductor memory apparatus according to claim 1, wherein each of the cell mats comprises a cell array region, and a driving circuit region which is defined around the cell array region.

3. The semiconductor memory apparatus according to claim 2, wherein the driving circuit region comprises:
sense amplifier blocks respectively disposed adjacent to a pair of opposing sides of the cell array region; and
sub word line blocks respectively disposed adjacent to the other pair of sides of the cell array region, perpendicular to the pair of sides having the sense amplifier blocks disposed adjacent thereto.

4. The semiconductor memory apparatus according to claim 3, wherein the plurality of power lines extend in a major axis direction of the sense amplifier blocks and are disposed over the sense amplifier blocks.

5. A semiconductor memory apparatus comprising:
a plurality of banks delimited on a semiconductor substrate and each having a plurality of cell mats which are disposed in a matrix shape;
a plurality of power lines disposed over predetermined portions of each of the plurality of banks, wherein the plurality of power lines extend in a major axis direction of sense amplifier blocks and are disposed over the sense amplifier blocks;
a column control region disposed adjacent to at least one of sides of each bank which are perpendicular to an extending direction of the power lines;
a plate electrode disposed between the semiconductor substrate and the plurality of power lines in each bank and extending over the column control region; and
contact parts disposed over the column control region and electrically connecting the power lines with the plate electrode.

6. The semiconductor memory apparatus according to claim 5,
wherein each of the cell mats comprises a cell array region and a driving circuit region which is defined around the cell array region, and
wherein the driving circuit region comprises:
sense amplifier blocks respectively disposed adjacent to one pair of sides of the cell array region, facing each other; and
word line driving blocks respectively disposed adjacent to the other pair of sides of the cell array region, perpendicular to the one pair of sides having the sense amplifier blocks disposed adjacent thereto.

* * * * *